United States Patent [19]

Peterson

[11] Patent Number: 4,609,241
[45] Date of Patent: Sep. 2, 1986

[54] PROGRAMMABLE PROGRAMMED SOCKET

[75] Inventor: Jerold J. Peterson, Gilbert, Ariz.

[73] Assignee: 4C Electronics, Inc., Mentor, Ohio

[21] Appl. No.: 614,275

[22] Filed: May 25, 1984

[51] Int. Cl.$^4$ .............................................. H01R 29/00
[52] U.S. Cl. ............................ 339/17 CF; 339/18 C; 361/410
[58] Field of Search ............. 339/17 CF, 17 N, 18 R, 339/18 B, 18 C, 18 P; 361/392–410, 414; 174/52 FP; 307/147; 357/70, 74; 200/292; 29/842, 843

[56] References Cited

U.S. PATENT DOCUMENTS

| | | | |
|---|---|---|---|
| 3,177,405 | 4/1965 | Grey | 339/17 E |
| 3,234,433 | 2/1966 | Braunagel | 339/17 N |
| 3,335,327 | 8/1967 | Damon et al. | 361/401 |
| 3,340,439 | 9/1967 | Henschen et al. | 339/17 CF |
| 3,691,429 | 9/1972 | Glaser | 361/409 |
| 4,072,380 | 2/1978 | Freehauf | 339/17 CF |
| 4,146,902 | 3/1979 | Tanimoto et al. | 357/6 |
| 4,287,569 | 9/1981 | Fukushima | 365/96 |
| 4,342,069 | 7/1982 | Link | 361/401 |
| 4,401,353 | 8/1983 | McDevitt, Jr. et al. | 339/18 C |
| 4,520,429 | 5/1985 | Hosking | 339/17 L |
| 4,540,226 | 9/1985 | Thompson et al. | 339/17 CF |

FOREIGN PATENT DOCUMENTS

| | | | |
|---|---|---|---|
| 2735746 | 2/1979 | Fed. Rep. of Germany | 339/275 B |
| 58-112157 | 7/1983 | Japan | 339/17 CF |
| 1023979 | 3/1966 | United Kingdom | 339/17 LC |

OTHER PUBLICATIONS

Electronics, DIP Switch, Dougherty, p. 112, 5-1975.
Article entitled "A Novel MOS PROM Using a Highly Resistive Poly-Si Resistor", from IEEE Transactions on Electron Devices Magazine, vol. ED-27, No. 3, Mar. 1980, pp. 317-320.

Primary Examiner—Neil Abrams
Attorney, Agent, or Firm—Renner, Otto, Boisselle & Lyon

[57] ABSTRACT

A socket can be readily programmed to adapt the pin out configuration of an integrated circuit for convenient plug-in use or substitution in an environment, such as a socket, ordinarily intended for a similar integrated circuit with a different pin-out configuration. The invention includes a support, a first plurality of electrical contacts mounted in a prescribed pattern on one side of the support, a second plurality of electrical contacts mounted in a similar prescribed pattern on the other side of the support, and a programmable device, such as an EPROM, to which all the contacts are connected that can be programmed to complete or to open electrical paths between contacts. Printed circuit traces and plated through holes couple respective first contacts on one side of the support and respective second contacts on the other side of the support to the programmable device. Encapsulating material about the support, traces thereon, preferably the programmable device, and contacts where they are joined to the traces provides structural strength and integrity for the device and environmental isolation for the contact/trace junctures and programmable device/trace. A cover guides pin contacts to engagement with respective female contacts in the programmed socket. The invention also relates to a method of effecting the desired programmed interconnections, a method of making the programmed socket and a programmable shunt device.

25 Claims, 12 Drawing Figures

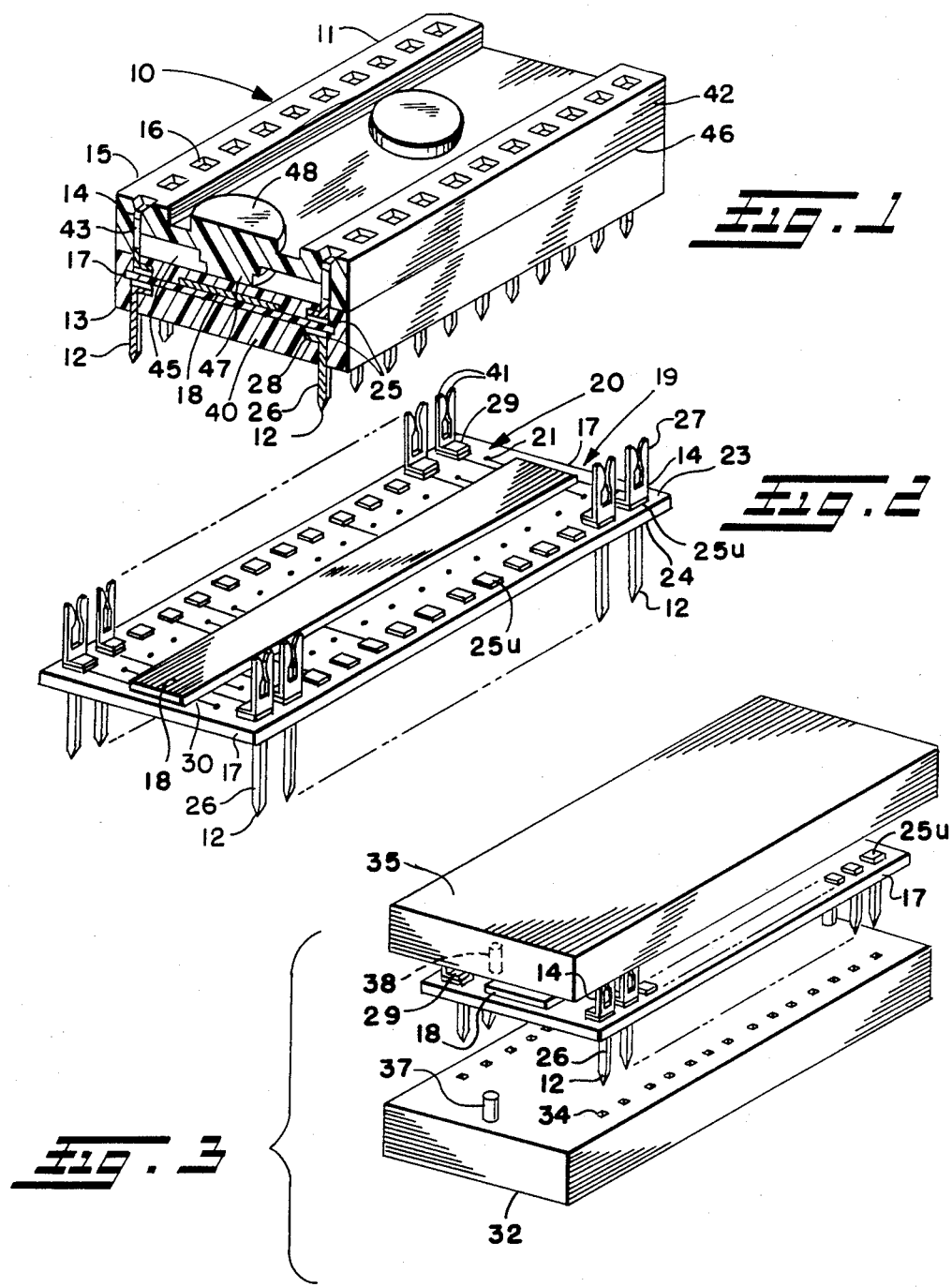

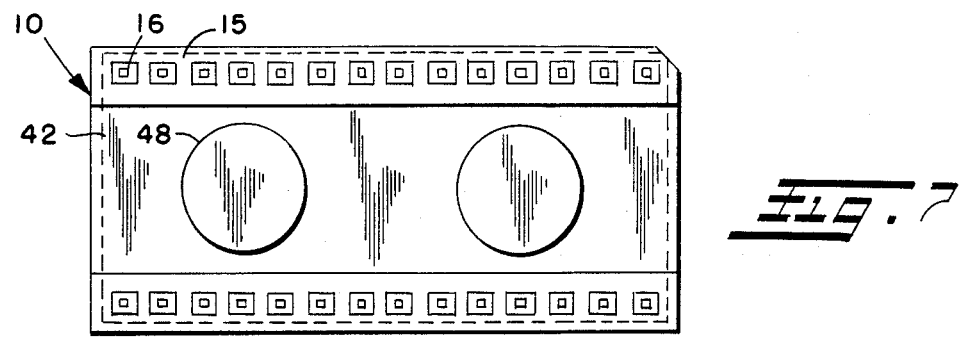
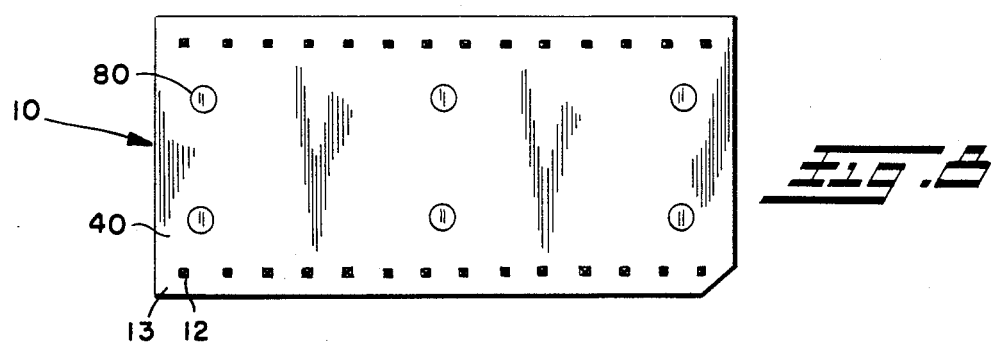
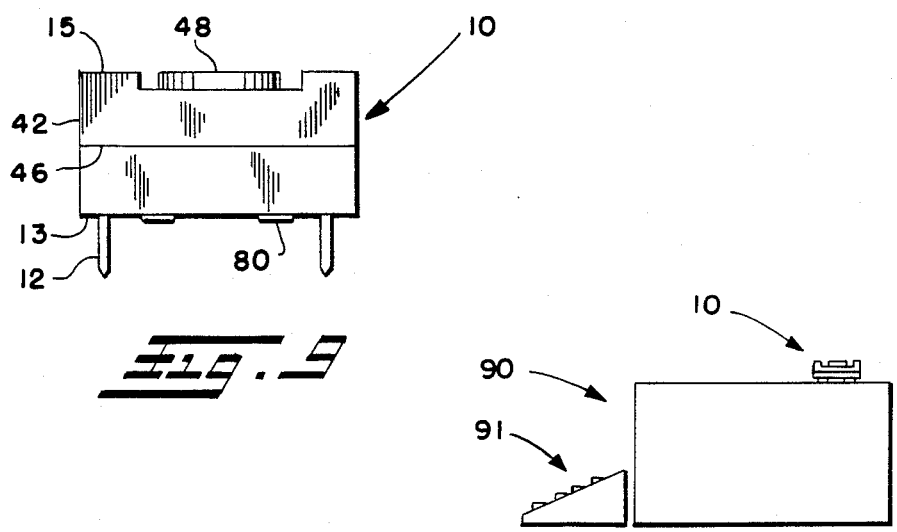

PROGRAMMABLE PROGRAMMED SOCKET

TECHNICAL FIELD

The present invention relates generally to electrical connectors and methods and, more particularly, to a programmable programmed socket and method for altering the effective pin-out arrangement and/or connections of integrated circuits and like devices.

BACKGROUND

In the modern electronics industry integrated circuits and similarly mechanically configured devices frequently are used. Such devices may be, for example, a microprocessor, a read only memory (ROM), a random access memory (RAM), logic arrays, integrated logic circuits, switches, etc. such devices usually are mechanically configured to have a three dimensional rectangular package body within which the active or passive circuitry components, switches, etc., are contained, and a plurality of electrical leads extending outwardly from the package to provide electrical connections for respective circuits etc. within the package to circuitry externally of the package. Such devices generally have a dual-in-line package (DIP) configuration. For convenience of description, each of such devices will be referred to hereinafter as an integrated circuit device; however, such label is intended to include the previously listed and other types of devices that are contained in a packaged configuration preferably of the DIP type with plural electrical leads extending outwardly from the package for the mentioned purpose. Moreover, such electrical leads sometimes are referred to as terminals, contacts, pins, etc., and for convenience of the following description, the same will be referred to as pins.

Electronic circuitry usually is designed for use with a particular integrated circuit, such as a specific microprocessor manufactured by a specific manufacturer and having a specific pin-out pattern or configuration whereby, for example, pin number 1 of the integrated circuit package may be intended to connect to a voltage source, pin number 2 may be an interrupt input for the microprocessor, pin number 3 may be a ground connection, etc. The layout and interconnections of printed circuit traces on a printed circuit board intended to use a specified microprocessor usually are designed for use with a particular microprocessor of a particular manufacturer. However, occasions arise that it becomes desirable, even necessary, to substitute in an electronic circuit a different integrated circuit device than the one for which the electronic circuit originally was designed, and in such a case it is possible that the new integrated circuit device cannot or cannot readily be substituted because it may have a pin-out configuration that is different from the pin-out configuration of the original integrated circuit device.

It would be desirable to facilitate, even more broadly to enable, the substitution of one integrated circuit device for another when the pin-out configurations of the two integrated circuit devices are not the same. It also would be desirable to accomplish the same in minimum space so that such an adaptation can be made with the frequently confined space available in various electronic devices.

In some circumstances it is desirable to connect one or more contacts in an integrated circuit socket to one or more other respective contacts, or to effect such connections directly on a printed circuit board, or in other embodiments. An example of such circumstances would be for security purposes, whereby a certain program could not be used unless a certain coded shunt were plugged into an integrated circuit socket to effect appropriate connections. It would be desirable to facilitate programming such connections to increase the security level while minimizing parts and/or manufacturing costs.

In copending, commonly assigned U.S. patent application Ser. No. 719,638, filed Apr. 4, 1985, which is a continuation of Ser. No. 471,280, filed Mar. 2, 1983, now abandoned and Ser. No. 571,737, filed Jan. 18, 1984, now U.S. Pat. No. 4,557,540, programmed socket devices, which are intended to adapt the pin-out configuration of one integrated circuit device to the pin-out configuration of another integrated circuit device are disclosed. In such applications connections between respective contacts on one side of the programmed socket device are made to contacts on the other side of the device using printed circuit traces, which include plated-through holes in the circuit board support structure within the device. The particular programming of the socket is effected according to the design of those printed circuit traces and plated-through holes. Thus, the programming of the sockets disclosed in such applications is effected during the actual manufacturing operation of the sockets, more particularly, during the forming of the printed circuit traces and plated-through holes in the particular desired pattern for a given socket. On the other hand, in accordance with the invention of the present application, the programmed socket has the ability to be programmable after manufacturing has been completed. The disclosures of the mentioned copending, commonly assigned patent application hereby are incorporated in their entireties by reference.

SUMMARY OF THE INVENTION

In accordance with the present invention a programmable programmed socket adapts an integrated circuit device with one pin-out configuration for use in circuitry designed for use with an integrated circuit device that has a different pin-out configuration. The invention also provides for effecting such adaptation in a small space. The invention, too, relates to a method of effecting such adaptation and a method of making a programmable programmed socket for the purposes expressed. Reference herein to a programmable programmed socket is intended to comprehend, where appropriate, a programmable programmed shunt useful to connect one or more contacts, etc., e.g. in an integrated circuit socket.

Briefly, the invention relates to an electrical connection device including a socket, a first plurality of electrical contacts mounted in a prescribed pattern with respect to the support of one side thereof for electrically coupling with respective first members engaging therewith, a second plurality of electrical contacts mounted in a prescribed pattern with respect to the support on another side thereof for electrically connecting with respective second members engaging therewith, a programmable device, such as a solid state electronics programmable device, an example being an erasable (or not) programmable read only memory (EPROM or PROM), to which some, preferably all, the contacts are connected, that can be programmed to establish selected open and closed circuits between respective contacts, and an arrangement of electrical conductors positioned with respect to the support for electrically coupling respective first and second contacts to the programmable device. According to the preferred embodiment and best mode of the invention, as is described in greater detail below, the programmable programmed socket effects the desired adaptation by providing two electrically isolated groups of contacts respectively on opposite sides of a support, providing a socket type package for the contacts and support, connecting the pins of one integrated circuit with the respective ones of the first group of contacts, connecting the other contacts respectively to other electrically conductive means, such as the contacts of an existing integrated circuit socket, for example, and using printed circuit traces on and plated through holes through the support and the programmable device to provide electrical connections between respective contacts on one side with respective contacts on the other side. As a result of the particular programming of the programmable device, the invention can be programmed to connect virtually any of the first group of contacts to any of the second group of contacts.

According to another aspect of the invention, a method of electrically coupling the terminals of one electrical device with circuitry configured electrically to couple with the terminals of another electrical device includes electrically connecting the terminals of the one device respectively to plural first electrical contacts mounted with respect to one side of the support, electrically connecting the terminals of another device respectively to plural second electrical contacts mounted with respect to another side of the support, electrically isolating a plurality of the first contacts from a plurality of the second contacts, and electrically coupling at least one contact on one side of the support with at least one contact on the other side of the support thereby to alter the apparent terminal configuration of at least one of such devices for electrical coupling with the other of such devices.

According to a further aspect of the invention, a method of making an electrical connector includes mounting a programmable device, such as a PROM, on a support, forming printed circuit traces on both sides of a support to provide electrical connections between contact locations on the support and the programmable device, mounting plural first electrical contacts on one side of the support in electrical isolation from each other and in electrical connection with respective printed circuit traces, and mounting plural electrical contacts on the other side of the support in electrical isolation from each other and from a plurality of the first contacts and in electrical connection with respective printed circuit traces, whereby respective first and second contacts are electrically connected via such printed circuit traces and the programmable device.

These and other objects and advantages of the present invention will become more apparent as the following description proceeds.

To the accomplishment of the foregoing and related ends, the invention, then, comprises the features hereinafter fully described in the specification and particularly pointed out in the claims, the following description and the annexed drawings setting forth in detail a certain illustrative embodiment of the invention, this being indicative, however, of but one of the various ways in which the principles of the invention may be employed.

BRIEF DESCRIPTION OF THE DRAWINGS

In the annexed drawings:

FIG. 1 is a partial isometric view, partly broken away in section, of a programmable programmed socket in accordance with the present invention;

FIG. 2 is an isometric view of the support, contacts, programmable devices, and some printed circuit traces used in the programmable programmed socket of FIG. 1;

FIG. 3 is an exploded isometric view of the support, contacts, and carrier blocks used in connection with the method of making a programmable programmed socket in accordance with the invention;

FIG. 7 is a top plan view of the programmable programmed socket looking generally in the direction of the arrows 7—7 of FIG. 6;

FIG. 8 is a bottom plan view of the programmable programmed socket looking generally in the direction of the arrows 8—8 of FIG. 6;

FIG. 9 is an end elevation view of the programmable programmed socket looking generally in the direction of the arrows 9—9 of FIG. 6; and FIG. 10 is a schematic view of apparatus for programming the programmable programmed socket according to the invention.

DETAILED DESCRIPTION OF THE INVENTION

Figure 4A:
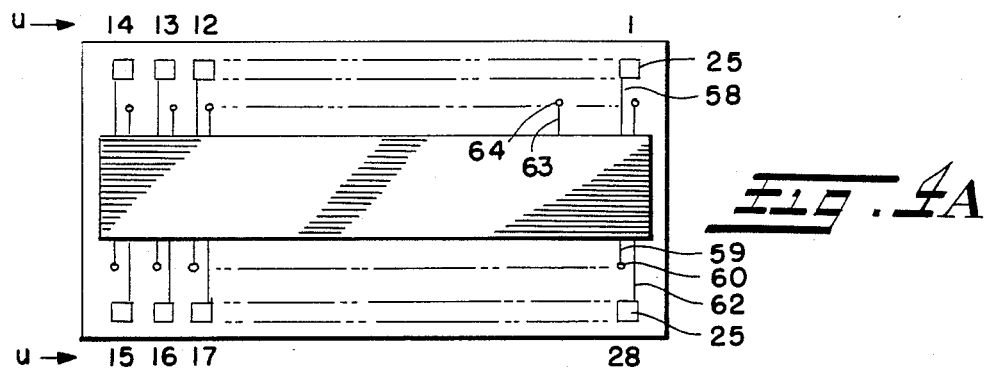
FIGS. 4A and 4B are, respectively, top and bottom views of the support of FIG. 2.

Referring now in detail to the drawings, wherein like reference numerals designate like parts in the several figures, the preferred embodiment and best mode of the present invention of a programmable programmed socket is generally indicated at 10 in FIG. 1. The programmable programmed socket 10 is in the configuration of an integrated circuit package, integrated circuit socket, etc., in the form of a dual in-line package 11. The fundamental components of the programmable programmed socket include a plurality of male pin contacts 12 extending from the bottom 13 of the package 11 for connection, for example, directly to the printed circuit traces on a conventional printed circuit board, say using wave soldering techniques to effect completion of connections, by an integrated circuit socket, etc.; a plurality of female fork type contacts 14 facing the top 15 of the package 11 to connect with the pins of an integrated circuit device inserted into openings 16; a support 17 for supporting the contacts; a programmable device 18 for electrically connecting respective contacts; and printed circuit connections 19 for connecting the contacts to the programmable device 18. The contacts 12, 14 may be of a type other than those shown, e.g. they both may be male, both female, or they may be of another configuration altogether.

The programmable programmed socket 10 of the present invention provides an interface between circuitry to which the male pin contacts 12 are connected and circuitry to which the female contacts 14 are connected. The male pin contacts 12 and the female contacts 14 preferably are arranged in identical patterns on the support 17 so that the programmed socket 10 requires minimum space, and the only electrical connections between respective male pin contacts 12 and respective female contacts 14 is by means of printed circuit connections 19 in the form of traces generally indicated at 20 on and plated through holes 21 through the support 17 and the programmable device 18.

The programmable device 18 according to the invention may be programmed to provide electrical connections between respective pairs or more of electrical contacts. An example of such a programmable device is a programmable read only memory (PROM), and another example would be an erasable programmable read only memory (EPROM). Considering a PROM, for example, such a device includes a plurality of leads for connection to other contacts, to printed circuit traces, etc., in the usual case, and solid state electronics constructed in the form of an array of electrical connections that connect each lead to each of the other leads. Using a conventional programming instrument, selected ones of those connections in the solid state electronics can be overloaded to burn out a fused link or connection thereby to open the circuit between one contact and another. By blowing the desired fuses to open selected circuits in the programmable device, then, such device can be programmed to leave only the desired or selected connections intact between respective pairs or more of the leads.

The programmable device may be die bonded to the surface of a printed circuit board material, such as that of which the support 17 is made. Moreover, the leads of the programmable device 18 may be wire bonded to respective printed circuit traces 20 formed on the support 17. The plated-through holes 21 enable the contacts on the side of the support 17 remote from the side on which the programmable device 18 is mounted to be connected to respective leads of the programmable device.

By programming the programmable device 18, the apparent location of any given pin of an integrated circuit device plugged into the top of the programmable programmed socket 10 can be programmed to appear at another selected location at the bottom of the programmed socket. Thus, for example, one integrated circuit device having pin number 28 as a ground may be replaced by another integrated circuit device that uses pin number 1 as the ground with the programmable programmed socket 10 of the present invention connecting contact location number 1 on the top of the programmable programmed socket to contact location number 28 on the bottom of the programmable programmed socket.

The support 17 preferably is a printed circuit board of electrically non-conductive material. The printed circuit traces 20 preferably are formed on the support 17 in conventional manner. The support 17 has a plurality of holes 21 therethrough, each of which preferably is plated through to provide an electrically conductive path from the top side or surface 23 to the bottom side or surface 24. (Reference to top and bottom or upper and lower as well as to surfaces and sides herein are for convenience only and are not intended to be limiting with respect to configuration or operation of the programmable programmed socket 10).

Each of the printed circuit traces 20 terminates in a terminal pad, such as those shown at 25 in FIG. 2. Each of the contacts 12, 14 has a contact portion 26, 27 extending generally linearly in a direction to be electrically connected to a member placed to engagement therewith and a flat base portion 28, 29 extending generally perpendicularly to the contact portion for electrical connection to respective terminal pads. Respective contacts 12, 14, are soldered to such pads 25 for electrical and mechanical connection thereto. Preferably the pads 25U (the suffix "U" indicating upper) on the top 23 and those pads 25L ("L" for lower) on the bottom 24 of the support 17 are arranged in an identical dual-in-line pattern, as is shown in the drawings, and, accordingly, the contacts 12 are arranged in the same configuration, layout, or pattern as are the contacts 14. Therefore, the pad 25U at contact location 1 on the top 23 is directly over the pad 25L at contact location 1 on the bottom 24 of the support 17. In the illustrated embodiment there are 28 contact locations on each side of the support 17 corresponding in number and spacing to the pins of a conventional 28-pin DIP integrated circuit device.

In accordance with one method of making the programmable programmed socket 10, the layout of the printed circuit traces 20 is determined and the printed circuit traces 20 and plated through holes 21 are formed on and through the support 17 in conventional manner, for example using a photoetching and plating technique. The programmable device 18 is die bonded or otherwise secured to or mounted on the support 17 and the leads 30 (only several of which are shown for convenience in FIGS. 2, 4A and 5A) are wire bonded to the respective traces 20 (only several of which also are shown for conenience). The contacts 12 then are placed in a carrier block 32 shown in FIG. 3, such that the pin contact portions 26 thereof extend into openings 34 in the carrier block and the contact bases 28 are positioned to engage respective terminal pads 25 on the bottom 24 of the support 17. In a similar manner the contacts 14 are mounted in openings (not shown) in the upper carrier block 35, being held therein, for example, by slight frictional forces, to place the bases 29 thereof in alignment with respective terminal pads 25 on the top surface 23 of the support 17. One or more alignment pegs 37 of the carrier block 32 fit into respective alignment openings 38 in the carrier block 35 to facilitate aligning the same and the contacts therein with respect to each other and preferably with respect to the support 17. Accordingly, the carrier blocks 32, 35 and the support 17 are generally sandwiched together to place the bases of the respective contacts 12, 14 into direct engagement with the respective terminal pads 25. Preferably such terminal pads 25 (or the bases of the contacts, if desired) have solder initially applied thereto prior to such sandwiching. Thereafter, with the sandwiching performed, heat may be applied to melt the solder thereby mechanically and electrically securing respective contacts to respective terminal pads 25. After the solder has solidified, the carrier blocks 32, 35 may be removed leaving the assembled support 17 and contacts 12, 14, as is shown in FIG. 2.

Alternatively, the contacts 12, 14 may be of the type disclosed in above-referenced patent application Ser. No. 571,737 and they may be assembled on the printed circuit terminal pads 25 in the manner disclosed in such application. Summarizing for convenience, a strap resiliently connects a respective pair of male and female contacts, which are placed in position on the terminal pads on opposite sides of the support while the strap resiliently holds the male contact, female contact and support in sandwich relation. The contact bases on the terminal pads may include a precoating of solder. Heat is applied to melt the solder to complete connection of the respective contact bases to respective contact bases. Thereafter, the resilient strap may be clipped to open the connection between the respective pair of male and female contacts.

Another step to further completion of the programmable programmed socket 10 is the encapsulating of the support 17, programmable device 18 and printed circuit traces 20 and plated-through holes 21 thereon, and preferably at least a portion of each of the contacts 12, 14, for example to a depth away from the surface of the support 17 that is adequate at least to cover the respective bases 28, 29 of the contacts. Such encapsulating may be carried out in a plastic injection molding machine to provide the encapsulating lower body 40 clearly seen in FIG. 1. The body 40 may be formed of electrically non-conductive plastic or plastic-like material having adequate strength securely to hold the male pin contacts 12 in relatively rigid extending format seen in FIG. 1 and also to hold the female contacts 14 securely with respect to the support 17, on the one hand, while permitting resilient bending of the contact tines 41 (FIG. 2) to receive a male contact inserted therebetween. In addition to providing the structural strength, the encapsulating body 40 also preferably provides an hermetic seal enclosing the junctions of the leads 19 (30) with respective traces 20 and of the terminal pads 25 with respective contacts 12, 14, which helps to prevent oxidation or other chemical activity at the junctions that would tend to reduce the electrical conductivity, for example, thereof. The encapsulating body 40 also protects the electrical integrity of the printed circuit traces 20 and plated through holes 21, for example helping to avoid damage thereto as forces are applied to the contacts 12, 14 during use of the programmed socket 10 and by preventing entry of foreign substances to various parts of the programmable programmed socket 10 to avoid damage, short circuiting, etc.

A cover 42 (FIG. 1) preferably of electrically nonconductive plastic or plastic-type material is placed over the female contacts 14 to protect the same and to guide male contacts, such as the pins of an integrated circuit device, through openings 16 to engage respective pairs of tines 41 of the female contacts. Within the cover 42 may be a plurality of discrete chamber areas 43 within which individual female contacts 14 are located and preferably guided into alignment with respective openings 16. A hollow space 45 formed in the cover provides resiliency thereof, minimizes material required, tolerates imperfections in the encapsulating body, and facilitates providing deformation space for the female contacts 14. The cover 42 is ultrasonically welded at 46 to the encapsulating lower body 40; alternatively, other means may be employed to secure together the cover and encapsulating body. Further securing the cover to the encapsulating body a weld tab 47 is formed on the bottom of the cover, and such weld tab is ultrasonically welded directly to the body 40. To strengthen the area of the cover 42 where each of preferably plural weld tabs 47 respectively depend are reinforced zones 48 comprising a relatively thick build-up of material.

The use of the weld tabs 47 and reinforcing zones 48 strengthening the cover 42 enables the cover as a whole to be of relatively low or thin profile, thereby reducing the space requirements for the programmable programmed socket 10. The encapsulating lower body 40 not only provides the above described encapsulating function, but also provides the lower exterior of the programmable programmed socket 10, thus further reducing the number of components required for the socket and the space requirements. Additionally, the strengthening ability of the encapsulating body 40 enables use of minimum size contacts and minimum thickness of the printed circuit board support 17, even further reducing the overall space requirements for the programmable programmed socket 10. The positioning of the contacts 12, 14 in identical patterns such that each respective pair of contacts 12, 14 on the top and bottom of the support 17 is directly aligned minimizes surface space requirements for the programmable programmed socket 10, too.

Figure 4B:
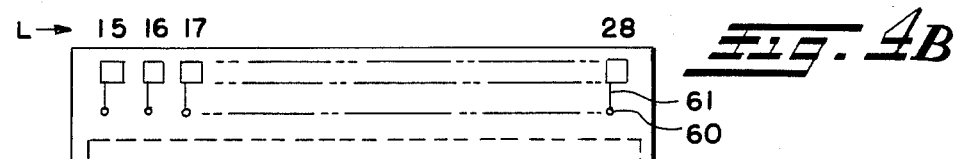

Turning to FIGS. 4A, 4B and 5, the interconnection technique for coupling respective pairs of contacts 12, 14 is illustrated. FIG. 4A shows a top view of the support 17, and FIG. 4B shows a bottom view of the support 17 with several representative printed circuit traces 20, plated through holes 21 and terminal pads 25, but without any of the contacts 12, 14. Pin location numbers 1-28 are shown along the edges of the top and bottom views of the support 17 with letters "U" designating upper and "L" designating lower surfaces of the support 17, respectively, in FIGS. 4A and 4B.

Figure 5A:
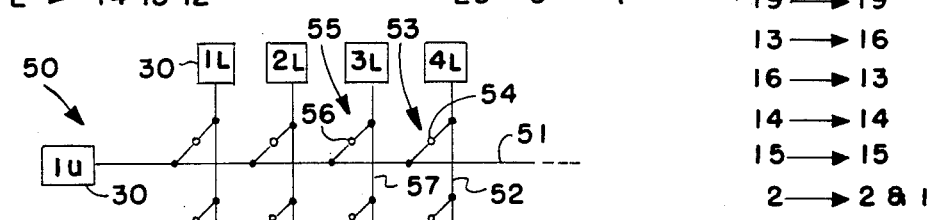
FIG. 5A is a partial view of a blowable fuse connection array in the programmable devices.

As is seen in FIGS. 4A and 4B, then, each of the terminal pads 25U and 25L is electrically connected via a respective printed circuit trace 20 to a respective lead 30 of the programmable device 18. In FIG. 5A there is illustrated schematically part of the array 50 of electrical connections existing initially in the programmable device 18. Each of the leads 30 shown in FIG. 5A of the programmable device is labeled with a respective pinout number corresponding to the intended terminal pad 25 to which such lead is intended for electrical connection via a respective printed circuit trace 20. For example, lead 30 which is designated "1U" is intended for electrical connection to terminal pad 25 designated "1U" shown at the upper right hand portion of FIG. 4A. Similarly, lead 30 designated "1L" in FIG. 5A would be connected to the terminal pad 25 designated "1L" in the lower right hand portion of FIG. 4B. Line 51 represents an effective electrical connection to lead 1U of FIG. 5A, and line 52, for example, represents an electrical connection to lead 4L in FIG. 5A. A circuit connection 53, including a fuse 54, electrically connects the lines 51 and 52. Similar circuit connections also are provided in the array 50 for connecting other respective pairs of electrical lines, as is well known. For example, an electrical connection 55, including a fuse 56, connects line 57 with line 51 in the array 50. The array 50 provides electrical connections between each of the leads 30 identified with a number and suffix "U" with all of the leads designated by a number and a suffix "L", for example, as is represented in FIG. 5A. If desired, each of the "U" leads also may be connected to each of the other "U" leads, and each of the "L" leads also may be connected to each of the other "L" leads.

To program the programmable device 18, for example, to assure that the lead 1U is connected only to lead 4L, then except for the circuit connection 53 including fuse 54, all of the circuit connections and fuses (for example including the circuit connection 55 and fuse 56) connecting to the lead 1U would be overloaded electrically to blow the respective fuses opening the respective circuit connections. Since the circuit connection 53 still would remain whole with the fuse 54 intact, the result would be a connection to the lead 1U to the lead 4L via the circuit connection 53 and appropriate portions of the electrical lines 51, 52. Depending on which of the circuit connections are so open circuited, the lead 1U may be connected to more than one other lead. Moreover, by providing appropriate isolation paths and connection paths, a lead designated with the suffix "U" may be connected to another lead designated by the suffix "U", and the same is true for leads with suffixes designated "L".

It will be appreciated that although the array 50 in the programmable device 18 is described in detail herein with reference to the blowing or burning out of a fused link or circuit connection, for example by overloading the same, other techniques similarly may be employed to program a similar programmable device. One example would be to load into the programmable device logic one and logic zero signals that would result in the opening or closing of certain circuits, gates, etc. In accordance with the invention it is preferred that the programmable device 18 be formed of what is known as CMOS material. CMOS material is operable at relatively low voltage but also is adequately hardy, i.e. has adequate capability, to handle relatively large voltages of the type commonly encountered in solid state electronic systems in particular. CMOS material also can be used in the present invention because although the current carrying ability of CMOS material is limited, the solid state electronic systems, integrated circuit systems, etc., with which the programmable programmed socket 10 ordinarily would be used usually employs relatively small currents.

In view of the foregoing, then, it will be appreciated that by appropriately programming the programmable device 18, the programmable device may be used ordinarily to effect connection of the contacts on one side of the support 17 to contacts on the other surface of the support 17. Those connections may be such that a contact in the first position on one surface of the support is connected to a contact at a different position on the opposite surface, or the connections may be provided between respective contacts in the same positions on opposite surfaces of the support.

Figure 5B:
FIG. 5B is a table illustrating an exemplary transposition of pin configurations achievable by the programmable programmed socket of the invention.

Thus, for example, in the first row of the chart in FIG. 5B, there is indicated an electrical connection between terminal pad 25U at location number 1 on the upper surface 23 with terminal pad 25L at location number 28 on the lower surface 24 of the support 17. Such connection is provided by a printed circuit trace 58, the programmable device 18, printed circuit trace 59, plated through hole 60, and printed circuit trace 61. The traces 58, 59 are on the upper surface 23, and the trace 61 is on the lower surface 24 of the support 17; the plated through hole 60 is an electrically conductive path between the traces 59, 61 between the upper and lower surfaces of the support 17. The second line in the chart of FIG. 5B indicates the connection between terminal pad 25U at location number 28 and terminal pad 25L at location number 5. Such connection is effected by the printed circuit trace 62 on the upper surface 23, programmable device 18, printed circuit trace 63, plated through hole 64, and printed circuit trace 65 on the lower surface 24 of the support 17. Other exemplary connections also are shown in the chart of FIG. 5B, which is representative only and is not intended to show, necessarily, all of the connections between contacts. It is noted that at lines 4 and 5 of the chart the contact at position 19 on the lower surface of support 17 is connected to both contacts at positions 10 and 19 on the upper surface, and a double connection also is shown in the last line of the chart. It will be appreciated that more than a double connection may be provided, or even an open circuit may intentionally be effected.

According to the preferred embodiment and best mode of the present invention, the particular programmed interconnection of terminal pads 25U with terminal pads 25L can be selected as desired or required for particular circumstances. The configuration illustrated herein for the interconnection pattern only is intended to be exemplary. Preferably each of the electrical contacts 12 is electrically isolated from the other and from those electrical contacts 14 on the opposite side of the support 17, and the same is true for the contacts 14; and the only interconnection between respective electrical contacts is via the programmable device 18 and printed circuit traces and/or plated through holes. In the usual case some of the respectively aligned contacts 12, 14, i.e. at the same contact locations, will be connected together and some of the respectively not aligned contacts 12, 14 will be connected together. To minimize the space requirements and to maximize the integrity of electrical connections provided by the programmable programmed socket 10, it is preferred that plated through holes be used to complete circuits from one side or surface of the preferably planar electrically non-conductive support 17 to the other side or surface thereof.

In some circumstances a hole may be formed in the support 17 to pass an electrical contact therethrough, whereby a single integral electrical contact is provided at the given location, such as location number 14, for both the lower contact 12 and upper contact 14 there when the upper and lower contacts at location number 14 are intended to be connected. This is not preferred for the sake of uniformity of manufacturing technique, facility of manufacturing, and strength of the programmed socket 10. Alternatively, the strapped contact approach mentioned above may be used, but such approach may require larger space requirements of the package 11 to accommodate disconnected strap portions that overhang edges of the support 17.

Figure 6:
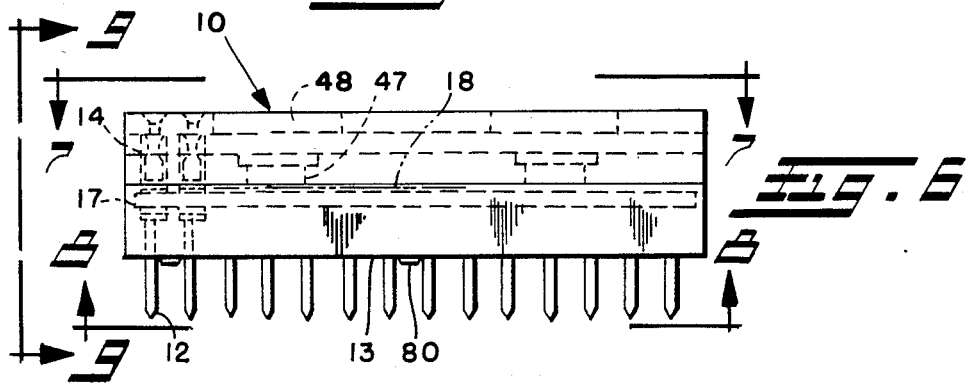
FIG. 6 is a side elevation view of a programmable programmed socket in accordance with the invention.

Briefly referring to FIGS. 6-9, the external layout of the programmed socket 10 is illustrated. The aligned pattern orientation of the contacts 12, 14 is seen in FIG. 6 protruding in parallel directions. The orientation of openings 16 in the top 15 of the socket 10 to guide respective pins into electrical connection with the female contacts 14 is seen particularly in FIGS. 6 and 7. The protruding male pin contacts 12 at the bottom 13 of the socket 10, and spacer bumps 80 are seen particularly in FIGS. 6, 8 and 9.

Turning to FIG. 10, an apparatus 90 for programming the programmable programmed socket 10 of the invention is shown. The apparatus 90 includes, for example, a keyboard 91 which may be operated manually, for example to input information for effecting the blowing of fuses or applying of logic one and logic zero signals, etc., with respect to the programmable programmed socket 10 in the course of programming the same. The apparatus 90 may be a conventional one used, for example, to program a PROM or an EPROM.

In view of the foregoing, it will be appreciated that the programmable programmed socket 10 in accordance with the present invention may be programmed insofar as the connections of respective contacts therein are concerned, and the socket then may be used to interface between an integrated circuit device (or, as was mentioned earlier, virtually any dual in line package type device or the like), and a socket, connector, circuitry, etc. to which such integrated circuit device is to be connected but otherwise would not be directly connectable because of an unfavorable or unmatched pin output/connection configuration. For example, a 28 pin integrated circuit that has pin 1 used as ground and pin 28 used as a Vcc input may be substituted in an electrical circuit that ordinarily uses a different integrated circuit that has pin 1 used as Vcc and pin 28 as ground, all other pins of both integrated circuit being the same or having the same function, etc., by connecting the substituting integrated circuit in a programmed socket 10 that connects contact 14 at location 1 to contact 12 at location 28 and contact 14 at location 28 to contact 12 at location 1 and connecting the programmable programmed socket to such electrical circuit.

Importantly, it will be appreciated that the programmable programmed socket 10 according to the invention may be manufactured essentially in a generic form, i.e. without any commitment being made to what the final programming thereof will be—the connections or programming of the programmable device 18 being undisturbed. An inventory of such programmable programmed sockets then may be maintained and provided to customers or used by a customer for any particular job requirement to effect specific pin adaptations. Accordingly, just prior to use of the programmable programmed socket 10 for a particular application, then, the socket may be programmed, as aforesaid.

STATEMENT OF INDUSTRIAL APPLICATION

The invention may be used to effect electrical connections and, more particularly, to adapt the pin-out configuration of one device to another pin-out configuration.

I claim:

1. A programmable electrical connection device, connectable between two electrical devices having terminal members arranged in respective terminal patterns, for establishing when programmed selected electrical paths between terminal members of such electrical devices, comprising
    a support,
    plural first electrical contact means mounted to said support in a prescribed pattern corresponding to the terminal pattern of one of the electrical devices for plug-in connection with respective terminal members of such one electrical device,
    plural second electrical contact means mounted to said support in a prescribed pattern corresponding to the terminal pattern of the other electrical device for plug-in connection with respective terminal members of such other electrical device, and
    electrically conductive means positioned with respect to said support for providing non-logical circuit shunt paths between each one of a plurality of said first contact means and everyone of a plurality of said second contact means for passive routing of electrical signals therebetween without any alteration of such signals or application of any logic function to said connection device, said conductive means being electrically programmable selectively to complete or to open any one or more of said non-logical circuit shunt paths to provide selected non-logical shunt paths between respective first contact means and second contact means so that electrical signals applied to each shunted one of said first contact means will be routed to a respective one of said second contact means or vice versa.

2. The device of claim 1, said support comprising a planar, electrically non-conductive support.

3. The device of claim 1, wherein the prescribed patterns, in which said first and second electrical contact means are mounted, are substantially the same.

4. The device of claim 1, said plural first electrical contact means comprising male pin contacts, and said plural second electrical contact means comprising female fork contacts.

5. The device of claim 1, said electrically conductive means comprising a solid state electronics programmable device having plural leads connected electrically to respective contact means, said programmable device being capable of being programmed to couple or to open circuit paths between respective electrical contact means.

6. The device of claim 5, further comprising printed circuit traces on said support, said traces comprising terminal pad means for mounting thereon respective first and second electrical contact means, and said first and second electrical contact means having respective base means for soldered attachment to respective terminal pad means.

7. The device of claim 6, each of said electrical contact means having a contact portion, and said base means comprising a portion of said contact means integral with and bent relatively perpendicularly with respect to said contact portion.

8. The device of claim 6, said support comprising a substantially planar electrically non-conductive support, said printed circuit traces being on opposite surfaces of said support and further comprising plated through holes for electrically connecting respective printed circuit traces on opposite surfaces of said support.

9. The device of claim 5, said electrically conductive means comprising CMOS material.

10. The device of claim 5, said electrically conductive means comprising a PROM.

11. The device of claim 5, said electrically conductive means comprising an EPROM.

12. The device of claim 5, said electrically conductive means comprising a solid state device having plural electrical leads, further comprising printed circuit traces on said support connected to respective contact means, said solid state device being die bonded to said support.

13. The device of claim 12, said electrical leads being wire bonded to respective printed circuit traces.

14. The device of claim 5, further comprising an electrically non-conductive encapsulating body molded directly to and about at least substantially all of said support, and at least part of said electrically conductive means, and of each of said electrical contact means to form an integral structure therewith.

15. The device of claim 14, said support comprising an electrically non-conductive substantially planar printed circuit board, further comprising printed circuit traces on both sides of said printed circuit board and plated through holes for electrically connecting respective traces on opposite sides of said printed circuit board, said printed circuit traces including terminal pads for connection to respective electrical contact means forming electrical junctures therewith and being connected to form junctures with respective leads of said programmable device, and said encapsulating means including means for encapsulating said junctures.

16. The device of claim 15, wherein said plural first electrical contact means comprises a plurality of female type electrical contacts, and further comprising cover means for covering said female contacts, said cover means including opening means therein for guiding respective male contacts into electrically conductive engagement with respective female contacts.

17. The device of claim 14, wherein said plural first electrical contact means comprises a plurality of female type electrical contacts, and further comprising cover means for covering said female contacts, said cover means including opening means therein for guiding respective male contacts into electrically conductive engagement with respective female contacts, said cover means and said encapsulating body being in engagement with each other about a perimeter of the device, and further comprising weld connection means about such perimeter for securely joining said cover means and said encapsulating body.

18. The device of claim 13, further comprising an electrically non-conductive encapsulating body molded directly to and about at least substantially all of said support, and at least part of said electrically conductive means, and of each of said electrical contact means to form an integral structure therewith.

19. The device of claim 18, wherein said plural first electrical contact means comprises a plurality of female type electrical contacts, and further comprising cover means for covering said female contacts, said cover means including opening means therein for guiding respective male contacts into electrically conductive engagement with respective female contacts, said cover means and said encapsulating body being in engagement with each other about a perimeter of the device, and further comprising weld connection means about such perimeter for securely joining said cover means and said encapsulating body.

20. The device of claim 1, said electrically conductive means comprising an array of electrical connections between a plurality of electrical leads, respective leads being connected to respective contact means, and each of said electrical connections including programmable means for determining which of said electrical connections is to form an electrical circuit between respective leads and which of said electrical connections is to open an electrical connection between respective leads.

21. The device of claim 20, said electrical connections including a blowable fuse for completing a circuit and capable of being blown to open a circuit.

22. The device of claim 1, wherein said support has opposite sides, and said plural first electrical contact means are mounted on one side of said support and said plural second electrical contact means are mounted on the other side of said support.

23. The device of claim 22, wherein at least some of said first electrical contact means are aligned with but electrically isolated from respective second electrical contact means.

24. A method of enabling the usage of a substitute electrical device with an electrical circuit component designed for plug-in connection with another electrical device where such substitute electrical device and electrical circuit component have functionally related terminal members located at different positions in respective terminal patterns, comprising the step of programming a programmable electrical connection device as set forth in claim 1 wherein the first contact means are arranged in a pattern corresponding to the terminal pattern of the substitute electrical device for plug-in connection with the terminal members of the substitute electrical device and the second contact means are arranged in a pattern corresponding to the terminal pattern of the electrical circuit component for plug-in connection with the terminal members of such electrical circuit component, said programming step including electrically programming the conductive means of the programmable electrical connection device to complete or open any one or more of said circuit paths to provide selected shunt paths between respective first contact means and second contact means which are located in their respective prescribed terminal patterns for plug-in connection with respective functionally related terminal members of the substitute electrical device and electrical circuit component, whereby the terminal members of the substitute electrical device will be operably coupled to functionally related but differently located terminal members of the electrical circuit component.

25. A programmable electrical connection device connectable between electrical leads of electrical devices for routing of signals therebetween, comprising
  a support,
  plural first electrical connection means on said support for connecting to electrical leads of one electrical device,
  plural second electrical connection means on said support for connecting to electrical leads of another electrical device, and
  electrically conductive means on said support for providing non-logical circuit shunt paths between each one of a plurality of said first electrical connection means and everyone of a plurality of said second electrical connection means for passive routing of electrical signals therebetween without any alteration of such signals or application or any logic function to said connection device, said conductive means being electrically programmable selectively to complete or to open any one or more of said non-logical circuit shunt paths to provide selected non-logical shunt paths between respective first electrical connection means and second electrical connection means so that electrical signals applied to each shunted one of said first electrical connection means will be routed to a respective one of said second electrical connection means or vice versa.

* * * * *